(12) United States Patent
Burchard et al.

(10) Patent No.: US 6,311,229 B1
(45) Date of Patent: *Oct. 30, 2001

(54) COLOR CODING IDENTIFICATION SYSTEM FOR A BLOCK I/O SYSTEM

(75) Inventors: Thomas H. Burchard, Winchester; Tina Hong, Medford; YoungMihn Kim, Lexington, all of MA (US)

(73) Assignee: Elsag International N.V. (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/868,032

(22) Filed: Jun. 3, 1997

Related U.S. Application Data (60) Provisional application No. 60/019,889, filed on Jun. 4, 1996.

(51) Int. Cl.⁷ .............................. H05K 7/16; G06F 13/00
(52) U.S. Cl. .................. 710/2; 710/8; 710/100; 361/600; 361/724
(58) Field of Search ........................ 361/683, 600, 361/724–788, 823–828; 439/488, 502, 924.1; 434/224; 710/2, 8–10, 100–104; 379/156, 329; 219/414

(56) References Cited

U.S. PATENT DOCUMENTS

| | | | |
|---|---|---|---|
| 3,566,004 | * 2/1971 | Creedon | 174/60 |
| 4,410,224 | * 10/1983 | Giulie | 439/48 |
| 4,543,716 | * 10/1985 | Damiano et al. | 29/871 |
| 4,712,232 | * 12/1987 | Rodgers | 379/329 |
| 5,661,631 | * 8/1997 | Crane, Jr. | 361/683 |
| 5,667,387 | * 9/1997 | Klemm | 434/224 |
| 5,681,183 | * 10/1997 | Dzmura | 439/502 |
| 5,726,424 | * 3/1998 | Koether | 219/414 |
| 5,727,055 | * 3/1998 | Ivie et al. | 379/156 |
| 5,751,558 | * 5/1998 | Gullicksrud et al. | 361/801 |
| 5,775,935 | * 7/1998 | Barna | 439/488 |
| 5,990,981 | * 11/1999 | Thompson et al. | 348/705 |
| 6,104,616 | * 8/2000 | Benson, Jr. et al. | 361/724 |

* cited by examiner

Primary Examiner—Christopher B. Shin
(74) Attorney, Agent, or Firm—Vytas R. Matas (57) ABSTRACT

A coding system for various I/O module elements of an I/O cabinet assembly is disclosed which is able to identify analog, digital and control I/O modules by appropriate functional representation combined with a distinct color code found on the front of each module and to identify appropriate internal field wiring connections in the identified module by the module identifying color. Each module has a written identification such as A—for analog, D—for digital and C—for control, I—for input, O—for output combined with an appropriate color bar identifying the type of module. Thus process and terminal blocks forming and I/O unit are easily matched for assembly and are easily inserted into an I/O cabinet in the proper location.

5 Claims, 7 Drawing Sheets

COLOR CODING IDENTIFICATION SYSTEM FOR A BLOCK I/O SYSTEM

CROSS-REFERENCE TO RELATED APPLICATIONS

This application is based on and expressly incorporates Provisional Application Serial No. 60/019,889 Filed Jun. 4, 1996 entitled COLOR CODING IDENTIFICATION SYSTEM FOR BLOCK I/O SYSTEM.

BACKGROUND OF THE INVENTION

1. Field of the Invention

The present invention relates generally to modular I/O electrical control assemblies comprised of a processor block and a I/O module and more particularly to systems for color coding I/O blocks to allow a proper assembly of the I/O processor block and I/O module and proper cabinet connecting of same.

2. Description of the Prior Art

In most systems requiring the assembly of individual parts into a system or element of that system a schematic along with an instructional booklet is used. Such a procedure becomes especially burdensom when you begin assembly of electronic control systems such as block I/O cabinetry. These systems first require the assembly of processor blocks and I/O modules into an I/O assembly according to appropriately coordinated identical module functions and a further co-ordination of these modules having the same function for identical type of signal input. As an example, identical digital input-output processor blocks for temperature signals could be mismatched with digital input-output I/O modules for line voltage or pressure signals. The result would be at the least an inoperative system.

Similar problems occur in field wiring the processor blocks of I/O modules which can have up to 24 channels which require specific input or output signals co-ordinated to the I/O block which must be not only identified as inputs or outputs but must also be the right type of inputs or outputs as was explained above.

Thus a foolproof assembly system for I/O block assemblies was needed which would identify each processor block and I/O module by its appropriate function as well as the type of input requiring the noted function to be performed thereon.

BRIEF SUMMARY OF THE INVENTION

The present invention solves the problems associated with prior art I/O system assembly as well as others by providing a label on both the processor block and the I/O module having a shorthand functional representation of the function as well as identifying by a color code the type of signal to be applied to the module. This assures that only identical function modules having identically identified signals shall be assembled into a unit assembly made up of a processor block and an I/O module or unit.

Additionally, the processor block has an internal label which is located next to each field wiring connection thereto and identifies the connection to be made thereto by its input or output function and also by the color code described earlier defining the type of input or output signal to be connected thereto. A scratch pad label is mounted inside a door of the processor block covering the field wiring connections where the wiring label information is repeated and having space provided next to each identified channel for the user to write in further information.

In view of the foregoing it will be understood that one aspect of the present invention is to provide a marking scheme for individual control components which are assembled together which will insure assembly of these components according to identical function performed and specific signal input for the function.

Another aspect of the present invention is to provide a label for assembled components denoting function according to a shorthand notation and input signals according to a color schematic.

Yet another aspect of the present invention is to provide field wiring labels allowing proper field wiring according to input, output and the type of signal applied.

These and other aspects of the present invention will be more fully understood after a review of the following description of the preferred embodiment when considering along with the associated drawings.

DETAILED DESCRIPTION OF THE PREFERRED EMBODIMENT

Figure 1:
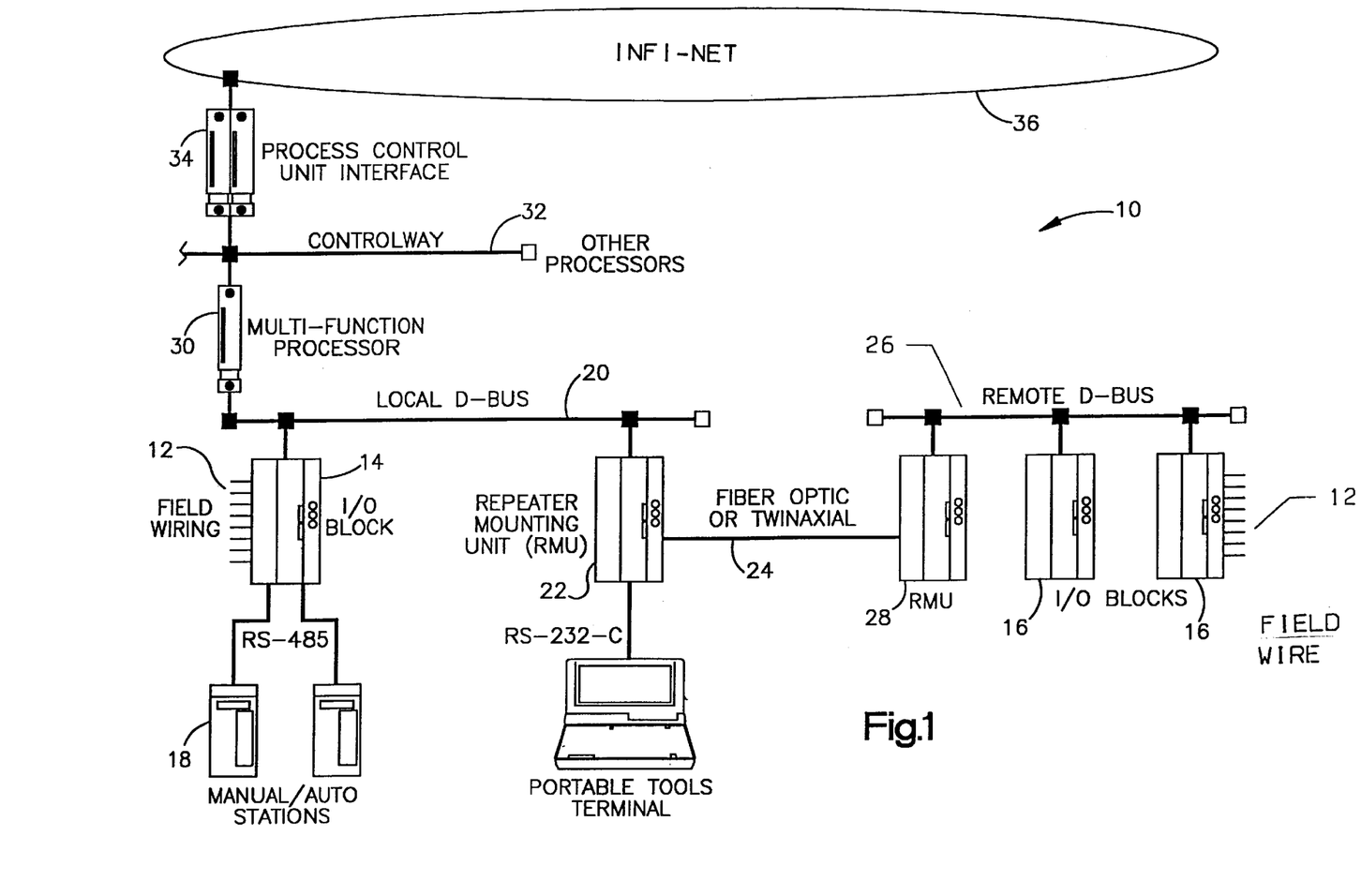
FIG. 1 is a schematic of a distributed process control system using the block I/O system cabinetry of the present invention.

Referring now to the drawings where the showings are intended to describe the preferred embodiment of the invention and not to limit it thereto, FIG. 1 shows a distributed process control system 10. Process signals are inputted along field wiring lines 12 to a series of local and remote I/O blocks 14, 16. Any of these blocks could be connected to manual/auto stations 18 for allowing operator control of the signals. Since the local D-bus 20 is relatively short (around 50 meters) a repeater mounting unit 22 (RMU) is connected to the local I/O block for conditioning the signal so it may be transmitted by either fiber optic or twinaxial cable 24 to a remotely located D-bus 26 by way of a second RMU 28 for reconditioning the signal transmitted by the first RMU so it is readable by the I/O blocks 16 connected to the remote D-bus.

The various process control signals collected along the local and remote D-bus 20, 26 are connected to a multi function control processor 30. Other processors may be also, connected to these D-buses and their control signals along with that of the processor 30 connected to a controlway 32 which sends the signals to a process control unit 34 for conditioning these signals for use by a control room process unit such as the Elsag Bailey INFI—NET process control system 36.

Figure 2:
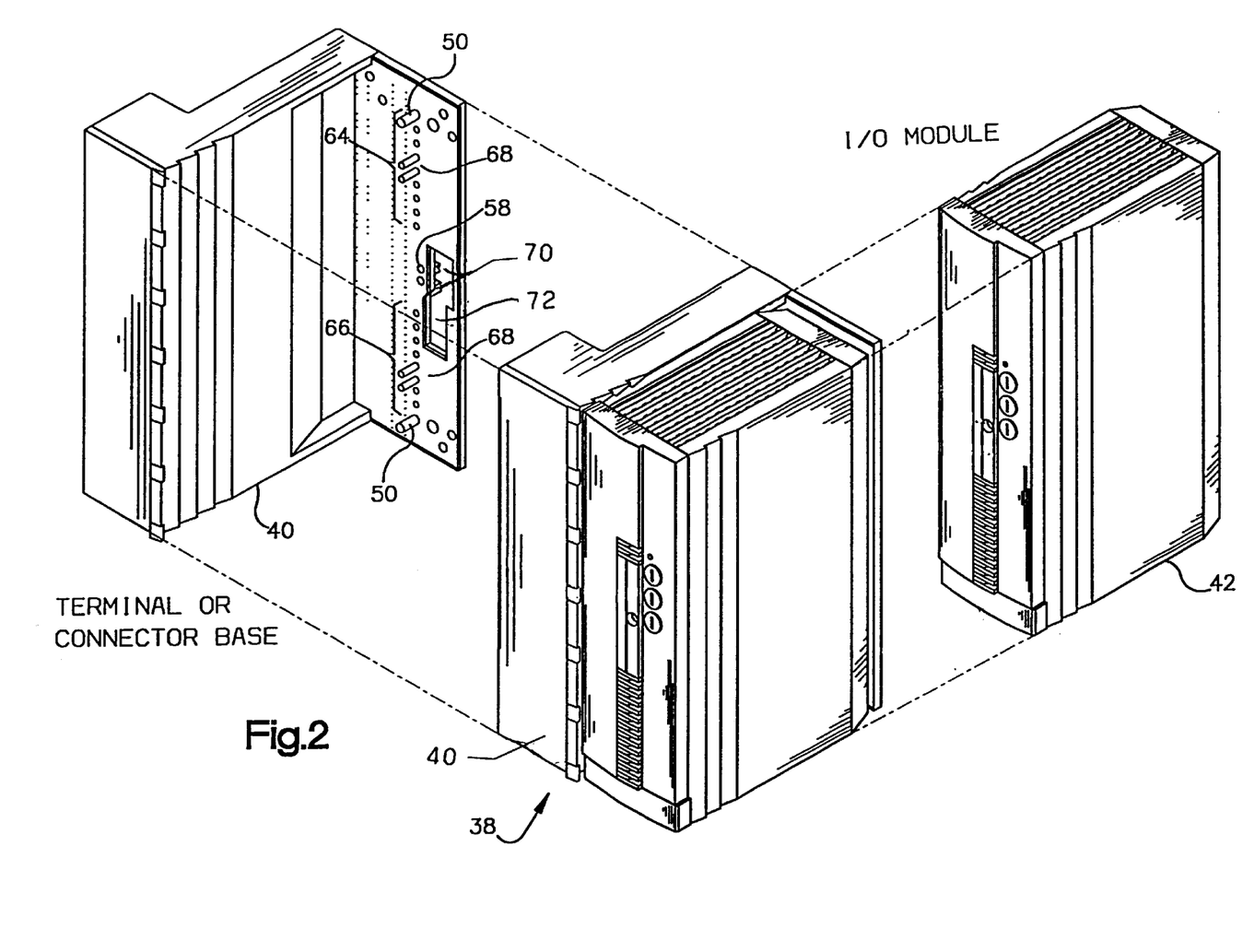
FIG. 2 depicts a block I/O assembly and the processor block and I/O module comprising same.
Figure 3:
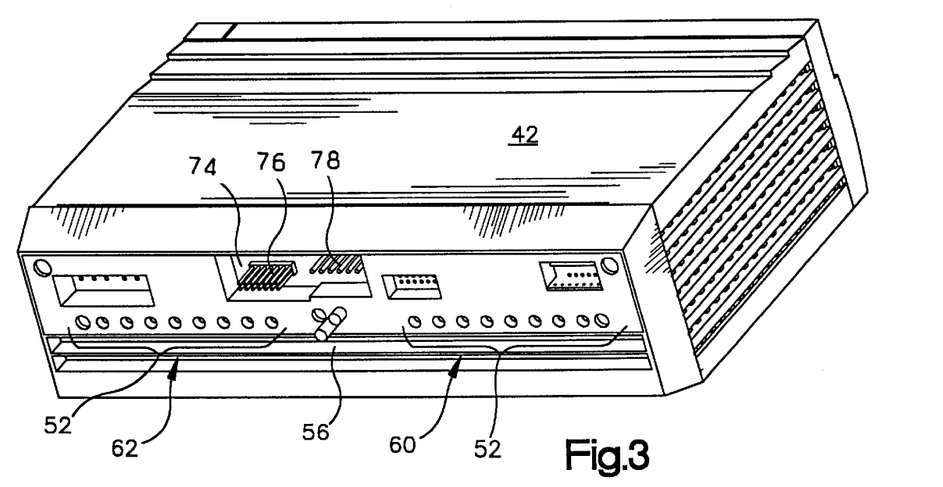
FIG. 3 a rear view of the I/O module showing the general pattern of holes found therein for orienting plugs therein according to an identifying pattern.
Figure 4:
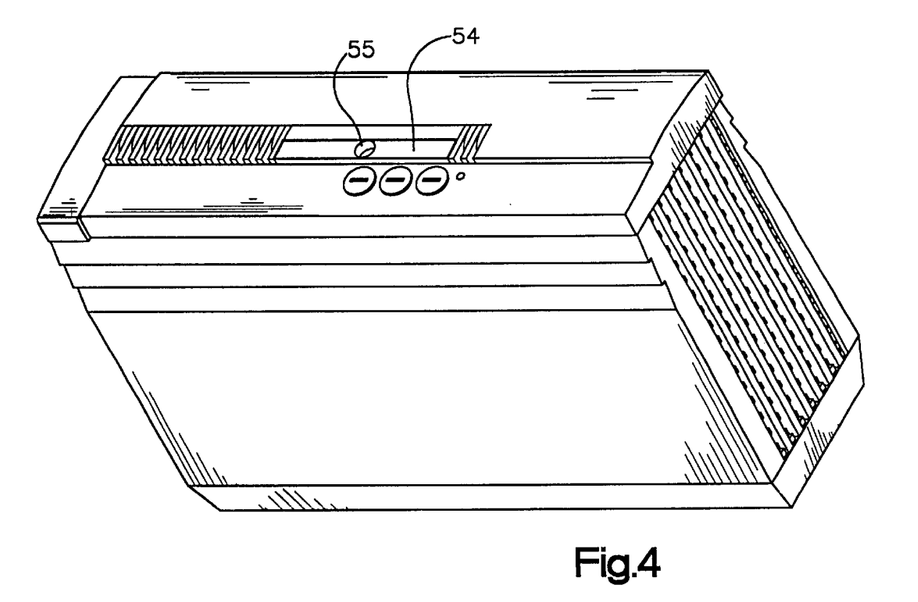
FIG. 4 is a front view of the I/O module.
Figure 5:
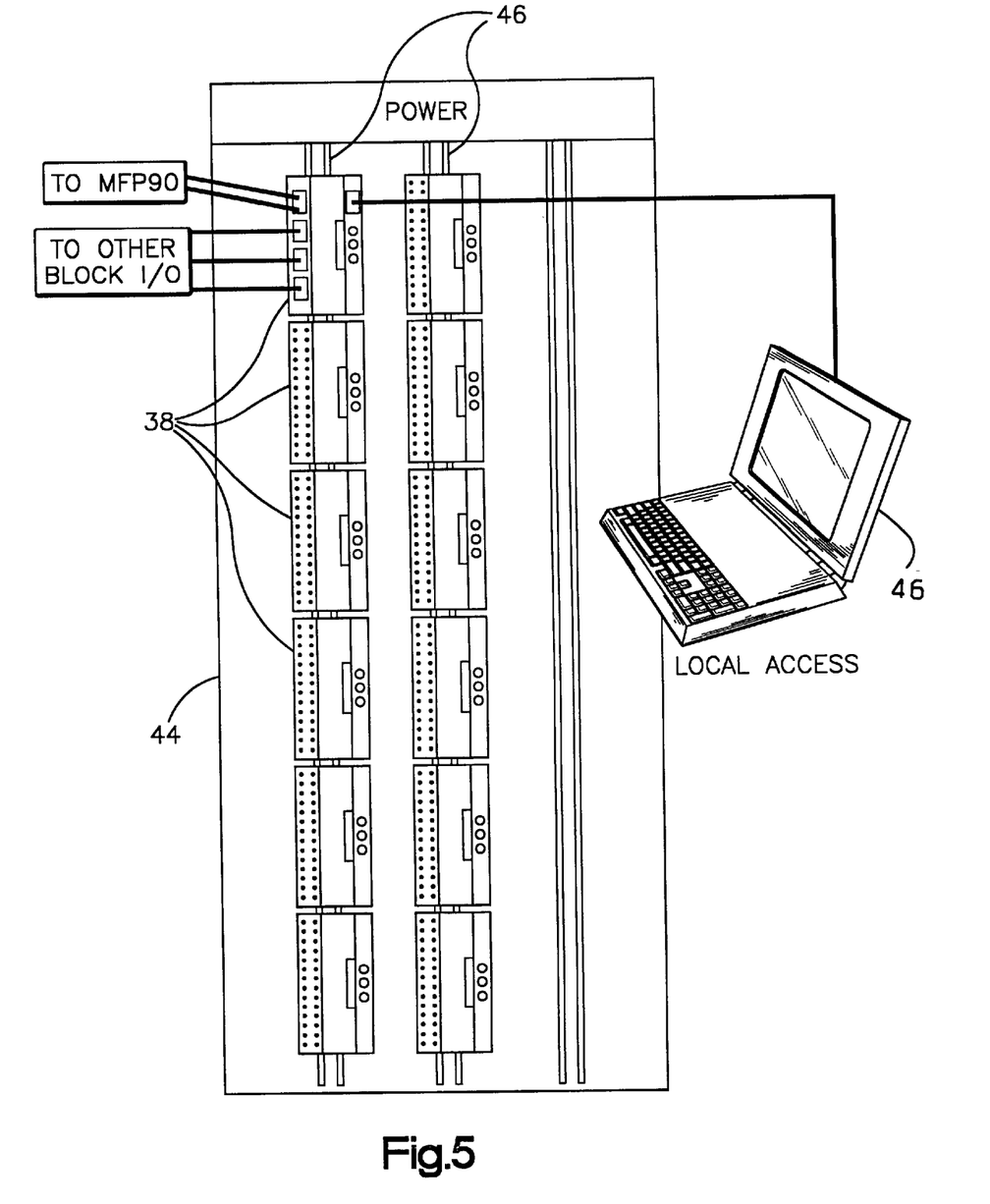
FIG. 5 is a front of a control cabinet having a plurality of I/O module assemblies connected therein.

As is shown in FIGS. 2–4, processor block or the basic I/O block 38 is made up of a terminal block or connector base 40 and a I/O module 42. The Processor Block is the front line controller which houses the electronic and configuration boards. The Terminal Block is used to terminate all field wires and route their signals back to the Processor Block. Each block 38 is specifically programmed or configured for a specific function and is mounted into a cabinet 44 best seen in FIG. 5. The individual block I/O's 38 are connected to communicate with each other in the Cabinet 44 as well as providing local access through a laptop computers 46.

The connector base 40 is mounted in a known manner such as by screws or clips to a conductive column 46 found in the cabinet 44 which provides power to the base 40 and therefrom to the assembled I/O blocks 38 as well as providing communication therebetween . The I/O module 42 is connected to the base 40 by pushing it onto guide pins 50 found on the back of the I/O module 42 as seen in FIG. 2. The module 42 is then locked to the base 40 by pushing a lock handle 54 to extend and lock the mechanism 56 into the base aperture 58.

Each individual I/O block 38 is programmed for a specific function and it is imperative to make sure that the proper module 42 is inserted into the proper base. To insure this ability the base and module are specifically configured to prevent the mating of a module with other than its properly connected base.

As best seen in FIGS. 2–4, this is accomplished by either upper and lower holes 60, 62 on the back of the module 42 which are alignable through the pegs 50 on the base 40 with complimentry eight upper and lower holes 64, 66 on the base 40 matching pins or pegs 68.

There are presently 12 different I/O modules being used. The existing I/O block are identified by the following code:

I=Input

O=Output

D=Digital

A=Analog

C=Control

Figure 6:
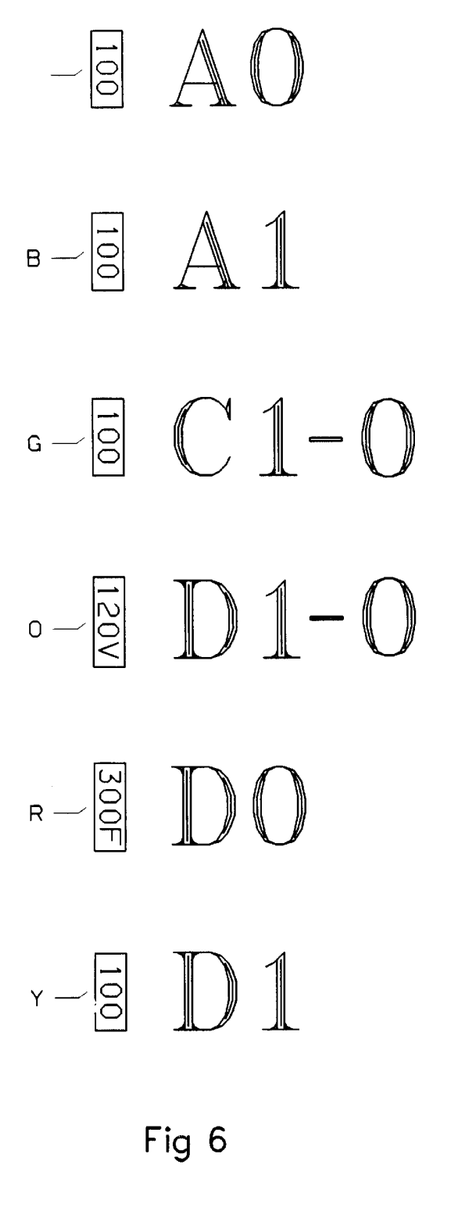
FIG. 6 is a table of abbreviations for various types of I/O modules and color codes for each of these types.

These codes are combined into various combinations some of which may be seen in FIG. 6. You would then read these combinations as analog output for AO, analog input for AI, control input-output for CI-O, digital input-output for DI-O, digital output for DO and digital input for DI.

As best seen in FIGS. 2–5, the conductive column 46 has known connectors (not shown) mounted into openings formed on a connector wall (not shown) of the cabinet 44 which provide power and signal connections 76, 78 respectively from the cabinet 44 to the I/O module 42. A pair of alignment pins 70 are found on the back of the I/O base or connector unit 40. When the unit 40 is mounted in the cabinet 44 the alignment pins 70 align the I/O unit through an opening 72 formed therein. This opening 72 matches an opening 74 found on the back of the I/O module 42 which has individual clustered power and signal pins 76, 78 which mate with an appropriate known power and signal assembly (not shown). The power pins 76 on the I/O module 42 will be electrically connected to the cabinet 44 before any signal pins 78 are connected to the cabinet by the proper mounting of the module 42 to the connector 40 into the I/O block assembly 38.

Since the present system 10 requires six different processor block 38 categories, six different colors were chosen to represent each category. Thus FIG. 6 shows a purple color bar P, a blue color bar B, a green color bar G, an orange color bar O, a red color bar R, and a yellow color bar Y as representing each of these six categories. It will be understood that any of these color bars could proceed any of the previously described functional representations shown in FIG. 6, in addition to the ones shown.

Figure 7:
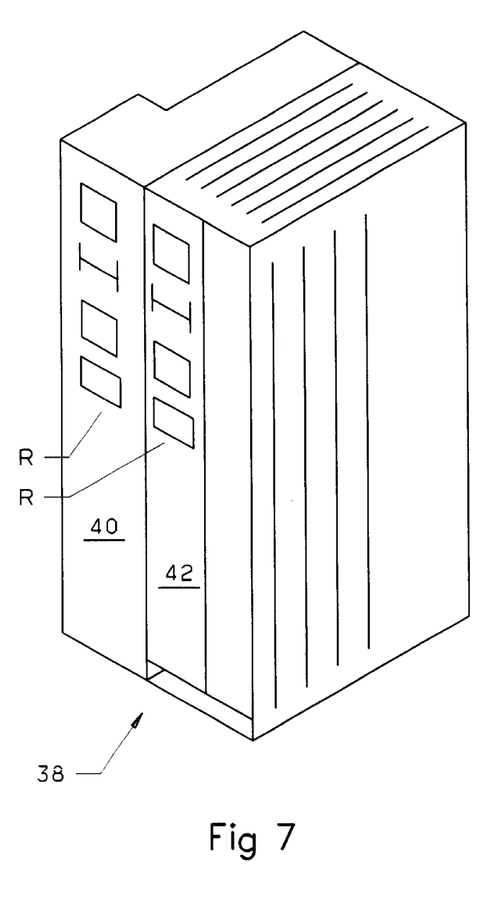
FIG. 7 is a perspective view of the combined processor block showing the color code and functions representation on matching connector base and I/O module making up the processor block.

As may be seen in FIG. 7, the I/O block 38 is thus easily matched to have the appropriate terminal block 40 and I/O module 42 by checking the logo and color bar on both for an identical match. Thus the terminal 40 which as a red R color bar and digital input-output functional representation DI-O is properly matched only with an I/O module 42 having a red R color bar and digital input-output DI-O representation stamped on each element 40, 42. This identification utilizes a family approach to identification, and as other blocks are added to the system they will follow the same design approach.

Figures 8, 9:
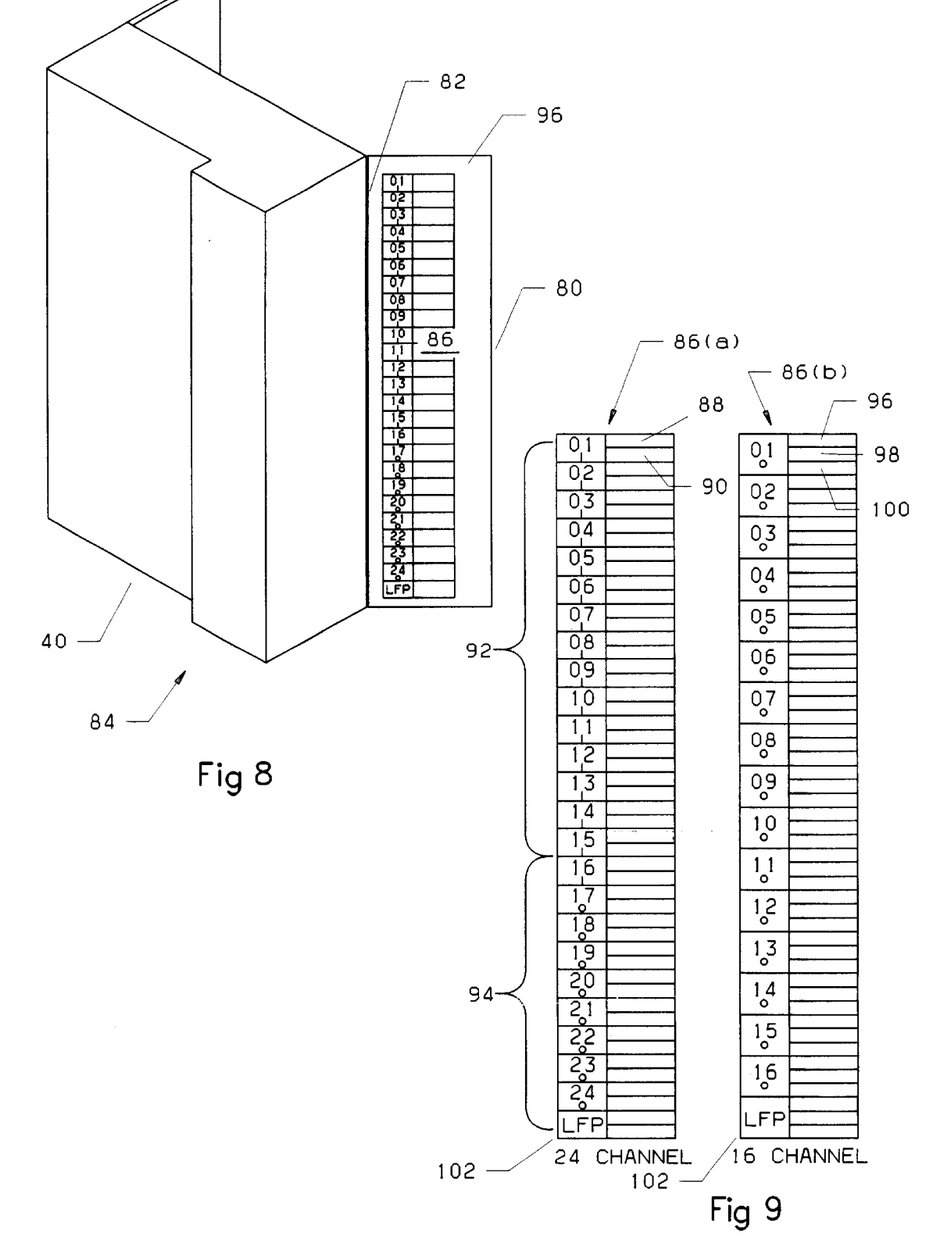
FIG. 8 is a perspective view of the processor block with its door open to reveal the field wiring connections.
FIG. 9 is a front view of a scratch pad label found on the inside of the processor block door of FIG. 8.

As is best seen in FIG. 8, the processor block 40 has a door 80 which is supported by hinges 82 to show a plurality of field wiring connectors 84 found therein.

A scratch pad label 86 is located inside the hinged door 80 of the Terminal Block. Its purpose is to both identify the specific wire numbers for each field wiring channel and differentiate between input and output channels. As best seen in FIG. 9 the scratch pad 86 may have either 24 channels or 16 channels 86a, 86b depending on the installation. The scratch pad 86(a) provides two areas 88, 90 next to each channel where the wire information can be written on to the label. The information on this label 86(a) is written on by the user at the site. To simplify this procedure, the door 80 swings open 180 degrees and is supported by the Processor Block 42. In the case of blocks where input 92 and output 94 channels are available, the label 86(a) has been color coded accordingly to the previously described color scheme for each channel and identified with "I"s and "O"s to simplify the wiring of these blocks. This label is manufactured by silk screening on paper stock with an adhesive layer on the back. It is located in place by a small recess 96 in the door 80. The 16 channel scratch pad 86(b) provides 3 areas 96,98,1200 next to each channel where 3 wire installation information is written in by the user. Each scratch pad 86(a), 86(b) has an individually labeled field power connection 102.

Figure 10:
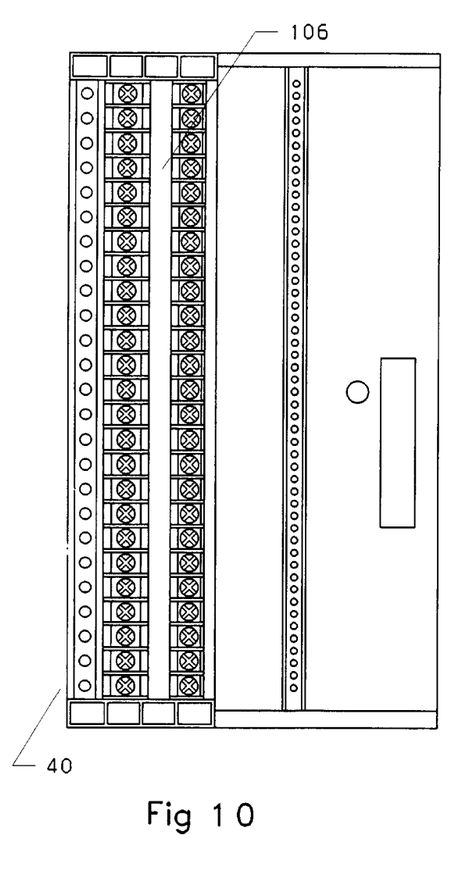
FIG. 10 is a front view of the processor block showing the field wiring channels found therein.
Figure 11:
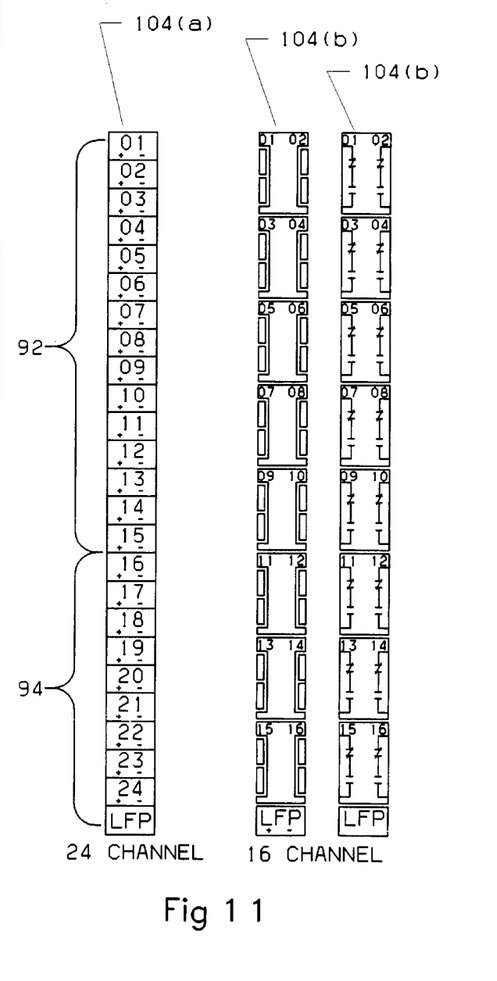
FIG. 11 is a depiction of the labels locatable in a recess between the individual channel connections identifying the channel number and color code.

As best seen in FIGS. 10 and 11, each field wired channel is physically identified by a label 104 which is mounted on the barrier strip 106 of the Terminal Block 40. Each channel is individually identified by labels 104(a) and 104(b) for both 16 and 24 channel versions both of which including one for field power. In the case of the input-output blocks 92, 94 the channel identification label has been similarly color coded though they are not identified with "I"s and "O"s due to space constraints. These labels are manufactured by reverse silk screening on clear plastic with an adhesive layer on the back. They are located in place by a small recess in the plastic barrier strip 106.

From the foregoing it will be seen that the present I/O block assembly system provides a foolproof assembly according to a unique functional coding combined with a color representation depicting one of six types of such functionally coded devices. It will be understood that certain improvements and additions which would be obvious to one of ordinary skill in this art area have been deleted herein for the sake of conciseness and readability but all such are intended to fall within the scope of the following claims.

What is claimed is:

1. A system of properly assembling a plurality of individual control signal and control function components into a selected one of a plurality of electronic I/O block assemblies for mounting in a distributed process control system and which have different control functions and different signal inputs as identified according to identical shorthand and color bar markings on both said control signal and control function components comprising;

a control signal connector base having a shorthand notation marked directly thereon to denote its signal inputs and having a color code bar accompanying said shorthand notation to denote which one of said plurality of distinct electronic I/O block assemblies having different control functions said control signal component belongs to;

a control function component I/O module having the same short hand notation and color code bar marked directly thereon as said control signal connector base;

wherein said control signal connector base and control function I/O module components are connected together into an electronic I/O block assembly only if they both have identical shorthand notations and color code bars to assure that the electronic I/O assembly is one having the same control function and required signal input; and wherein said identical shorthand notations and color code bars are clearly visible on said connector base and said I/O module of said I/O block assembly after they are connected together.

2. A system as set forth in claim 1 wherein said plurality of electronic assemblies includes six different color types of field wired signals connected to said electronic assemblies.

3. A system as set forth in claim 2 wherein said electronics assembly has a hinged door covering said field wiring connections and wherein a scratch pad sheet is mounted on the inside surface of said door which identifies each of said connector pairs by either input or output and is color coded to identify the type of signal.

4. A system as set forth in claim 3 wherein said scratch pad sheet includes a pair of lines by each identified connector pair for writing in information by the user regarding said connector pair.

5. A system as set forth in claim 1 wherein said shorthand notation marked on both said first and second component is a combination of the following letters denoting the function of the component:

A=Analog
D=Digital
C=Control
I=Input
O–output.

* * * * *